(12) United States Patent
Ma

(10) Patent No.: US 10,504,981 B2
(45) Date of Patent: Dec. 10, 2019

(54) ARRAY SUBSTRATE WITH TOUCH ELECTRODE LEAD ARRANGED AT TOP POSITION, OLED DISPLAY PANEL, METHODS OF MANUFACTURING THE SAME, AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 43 days.

(21) Appl. No.: 15/214,044

(22) Filed: Jul. 19, 2016

(65) Prior Publication Data
US 2017/0192566 A1    Jul. 6, 2017

(30) Foreign Application Priority Data
Jan. 4, 2016    (CN) .......................... 2016 1 0004720

(51) Int. Cl.
*G06F 3/044*    (2006.01)
*H01L 27/32*    (2006.01)
*H01L 51/52*    (2006.01)

(52) U.S. Cl.
CPC .......... *H01L 27/3262* (2013.01); *G06F 3/044* (2013.01); *H01L 27/323* (2013.01);
(Continued)

(58) Field of Classification Search
CPC .................................................. H01L 27/323
See application file for complete search history.

(56) References Cited

U.S. PATENT DOCUMENTS 5,427,983 A * 6/1995 Ahmad ................. C23C 14/042
148/DIG. 105
9,740,325 B2    8/2017 Yang et al.
(Continued)

FOREIGN PATENT DOCUMENTS

CN    103186303 A    7/2013
CN    103270476 A    8/2013
(Continued)

OTHER PUBLICATIONS

First Chinese Office Action regarding Application No. 201610004720.4 dated Feb. 24, 2018. Translation provided by Dragon Intellectual Property Law Firm.
(Continued)

*Primary Examiner* — Chad M Dicke
(74) *Attorney, Agent, or Firm* — Harness, Dickey & Pierce, P.L.C.

(57) ABSTRACT

The present disclosure provides an array substrate including a display region and a peripheral region. The display region comprises an anode, an organic material functional layer and a cathode that are arranged on a base substrate in sequence. The peripheral region includes a plurality of touch electrode leads that is insulated from each other, and each of the touch electrode leads includes a first touch electrode lead and a second touch electrode lead. The first touch electrode lead is arranged at a top position of the array substrate relative to an upper surface of the base substrate, and electrically connected to a corresponding touch electrode arranged on a packaging substrate. The second touch electrode lead is arranged at a position close to the base substrate. A thickness of the first touch electrode lead is greater than a thickness of the cathode.

20 Claims, 7 Drawing Sheets

(52) U.S. Cl.
CPC ...... *H01L 27/3276* (2013.01); *H01L 51/5237* (2013.01); *G06F 2203/04103* (2013.01); *H01L 2227/323* (2013.01)

(56) References Cited

U.S. PATENT DOCUMENTS

| | | | |
|---|---|---|---|
| 2007/0020852 A1* | 1/2007 | Umezawa .......... | G11C 16/0433 438/259 |
| 2010/0007616 A1 | 1/2010 | Jang | |
| 2010/0231490 A1* | 9/2010 | Okano ............... | H01L 27/3246 345/80 |
| 2012/0153273 A1* | 6/2012 | Takada ............... | C07F 15/0033 257/40 |
| 2013/0169558 A1 | 7/2013 | Min | |
| 2013/0169569 A1* | 7/2013 | Shih ...................... | G06F 3/041 345/173 |
| 2013/0271675 A1* | 10/2013 | Misaki ................. | G06F 3/044 349/12 |
| 2013/0277650 A1 | 10/2013 | Yoneya et al. | |
| 2014/0184951 A1* | 7/2014 | Yeh ........................ | G06F 3/044 349/12 |
| 2015/0162387 A1* | 6/2015 | Gu ........................ | G06F 3/0412 345/174 |
| 2015/0234503 A1* | 8/2015 | Min ........................ | G06F 3/047 345/173 |
| 2016/0266707 A1* | 9/2016 | Nozaki ................... | G06F 3/044 |
| 2016/0274719 A1 | 9/2016 | Yang et al. | |

FOREIGN PATENT DOCUMENTS

| | | |
|---|---|---|
| CN | 103353817 A | 10/2013 |
| CN | 103376580 A | 10/2013 |
| CN | 104217677 A | 12/2014 |
| CN | 104793828 A | 7/2015 |
| JP | 2015138348 A | 7/2015 |

OTHER PUBLICATIONS

Second Chinese Office Action regarding application No. 201610004720.4 dated Nov. 21, 2018. Translation provided by Dragon Intellectual Property Law Firm.

* cited by examiner

ARRAY SUBSTRATE WITH TOUCH ELECTRODE LEAD ARRANGED AT TOP POSITION, OLED DISPLAY PANEL, METHODS OF MANUFACTURING THE SAME, AND DISPLAY DEVICE

CROSS-REFERENCE TO RELATED APPLICATION

This application claims a priority to Chinese Patent Application No. 201610004720.4 filed on Jan. 4, 2016, which is incorporated herein by reference in its entirety.

TECHNICAL FIELD

The present disclosure relates to the field of the display technology, in particular to an array substrate, an Organic Light-Emitting Diode (OLED) display panel, methods for manufacturing the array substrate and the OLED display panel, and a display device.

BACKGROUND

The OLED is an organic thin film electroluminescent device, and it has advantages such as a simple manufacturing process, low costs, being easy to form a flexible structure and a wide viewing angle. Therefore, the technique of displaying with the OLEDs has become an important display technique.

In addition, along with the development of the display technique, the touch panel has been developed rapidly. Due to its features such as positioning in an accurate and sensitive manner, nice feel and a long service life, the capacitive touch screen has attracted more and more attention.

Currently, most of the OLED display devices that have the touch function on the market use the on-cell Touch Panel, i.e. the touch electrodes are formed at an upper surface of a packaging substrate of the OLED display panel.

However, when the touch electrode is formed on the upper surface of the packaging substrate, the packaging substrate cannot be successfully thinned so that a thickness of the OLED display panel cannot be reduced satisfactorily, which cannot meet the market requirement for thinner display panels.

SUMMARY

An object of the present disclosure is to provide an array substrate, an OLED display panel, methods of manufacturing the same, and a display device so as to thin whole of the OLED display panel and ensure contact stability at a position where the array substrate and the packaging substrate are contacted.

For achieving the above object, the present disclosure provides in some embodiments the following technical solutions.

In one aspect, the present disclosure provides in some embodiments an array substrate, which includes a display region and a peripheral region, wherein the display region includes an anode, an organic material functional layer and a cathode that are arranged on a base substrate in sequence, wherein the peripheral region includes a plurality of touch electrode leads that is insulated from each other, and each of the touch electrode leads includes a first touch electrode lead and a second touch electrode lead; the first touch electrode lead is arranged at a top position of the array substrate relative to an upper surface of the base substrate, and electrically connected to a corresponding touch electrode arranged on a packaging substrate; the second touch electrode lead is arranged at a position close to the base substrate, wherein one end of the second touch electrode lead is electrically connected to the first touch electrode lead, and the other end of the second touch electrode lead is electrically connected to a touch Integrated Circuit (IC); and a thickness of the first touch electrode lead is greater than a thickness of the cathode.

Alternatively, the first touch electrode lead is formed by a layer of metal wires.

Alternatively, the first touch electrode lead is formed by two layers of metal wires overlapping each other completely, and a lower one of the two layers of metal wires is arranged on a same layer as the cathode.

Alternatively, the array substrate further includes TFTs arranged between the base substrate and the anode, wherein each of the TFTs includes a gate electrode, a source electrode and a drain electrode; and the second touch electrode leads are arranged on a same layer as the gate electrodes, or the second touch electrode leads are arranged on a same layer as both the source electrodes and the drain electrodes.

Alternatively, a packaging region is included within the peripheral region, wherein the first touch electrode lead is arranged at a position between the packaging region and the display region.

Alternatively, the first touch electrode lead has a thickness ranging from 1000 Å to 3000 Å.

Alternatively, the organic material functional layer includes a light-emitting layer, an electron transport layer and a hole transport layer arranged at two sides of the light-emitting layer respectively, an electron injection layer arranged between the cathode and the electron transport layer, and a hole injection layer arranged between the anode and the hole transport layer.

Alternatively, the touch electrode is arranged on the packaging substrate at a side facing the array substrate.

In another aspect, the present disclosure provides in some embodiments an OLED display panel, which includes the above array substrate and a packaging substrate. The touch electrodes, touch electrode wires electrically connected to the touch electrodes and a protection layer are arranged on the packaging substrate at a side facing the array substrate, and at least a portion of each of the touch electrode wires is not covered by the protection layer; and the touch electrode wires and first touch electrode leads are arranged in one-to-one correspondence manner, and the uncovered portion of each of the touch electrode wires is in direct contact with the corresponding first touch electrode lead.

In yet another aspect, the present disclosure provides in some embodiments a method of manufacturing an array substrate, which includes steps of: forming, on a base substrate within a display region of the array substrate, an anode, an organic material functional layer and a cathode in sequence; and forming, within a peripheral region of the array substrate, a plurality of touch electrode leads that is insulated from each other, wherein each of the touch electrode leads includes a first touch electrode lead and a second touch electrode lead; the first touch electrode lead is formed at a top position of the array substrate relative to an upper surface of the base substrate by an evaporation process, and electrically connected to a corresponding touch electrode arranged on an packaging substrate; the second touch electrode lead is formed at a position close to the base substrate by a patterning process, wherein one end of the second touch electrode lead is electrically connected to the first touch electrode lead, and the other end of the second touch electrode lead is electrically connected to a touch IC; and a thickness of the first touch electrode lead is greater than a thickness of the cathode.

Alternatively, the first touch electrode lead is formed by a layer of metal wires, and the step of forming the plurality of first touch electrode leads includes steps of: for each of the first touch electrodes, aligning an opening of a first mask plate with each of the first touch electrode leads to be formed; and forming each of the first touch electrode leads by evaporating a metal material.

Alternatively, the first touch electrode lead is formed by two layers of metal wires overlapping each other completely, and the step of forming the plurality of first touch electrode leads includes steps of: for each of the first touch electrodes, aligning openings of a second mask plate with one of the two layers of metal wires and the cathode to be formed respectively; forming the cathode and the one of the two layers of metal wires by evaporating a cathode metal material; aligning an opening of a first mask plate with the other one of the two layers of metal wires to be formed; and forming the other one of the two layers of metal wires by evaporating a metal material.

Alternatively, the manufacturing method also includes a step of forming TFTs, wherein each of the TFTs includes a gate electrode, a source electrode and a drain electrode; and the second touch electrode leads and the gate electrodes are formed by a single pattering process, or the second touch electrode leads, the source electrodes and the drain electrodes are formed by a single patterning process.

In a fourth aspect, the present disclosure provides in some embodiments a method of manufacturing an OLED display panel, which includes steps of: forming an array substrate according to the above method of manufacturing an array substrate; forming touch electrodes, touch electrode wires electrically connected to the touch electrodes and a protection layer on a packaging substrate, wherein at least a portion of each of the touch electrode wires is not covered by the protection layer; reversing the packaging substrate to enable the protection layer to face the array substrate, and attaching the packaging substrate to the array substrate to enable the uncovered portion of each of the touch electrode wires to be in direct contact with a corresponding first touch electrode lead of the array substrate, wherein the touch electrode wires and first touch electrode leads are arranged in one-to-one correspondence manner; and thinning the base substrate of the array substrate and the packaging substrate synchronously.

In yet another aspect, the present disclosure provides a display panel including the above OLED display panel.

The present disclosure provides an array substrate, an OLED display panel, a method of manufacturing the same and a display device. The touch electrodes and the touch electrode wires electrically connected to the touch electrodes may be provided on the packaging substrate at a side facing the array substrate. Thus, after the array substrate is attached to the packaging substrate, the base substrate of the array substrate and the packaging substrate can be thinned synchronously so as to reduce the thickness of the whole OLED display panel. Since the thickness of the first touch electrode leads is relatively large, it is avoided a poor contact between the first touch electrode leads and the touch electrode wires on the packaging substrate at the contacting position due to a small thickness of the first control electrode leads, so as to ensure the contact stability. In addition, when the touch electrode leads are provided on the array substrate, the touch IC and the driving display IC may be bonded synchronously, so as to realize a simpler manufacturing process.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

REFERENCE SIGN LIST

100: array substrate;
200: packaging substrate;
01: display region;
02: peripheral region;
03: packaging region;
10: base substrate;
11: anode;
12: organic material functional layer;
13: cathode;
14: pixel definition layer;
15: TFT;
20: touch electrode lead;
21: first touch electrode lead;
22: second touch electrode lead;
31: touch electrode;
32: touch electrode wire;
40: protection layer;
50: first mask plate;
501: opening;
60: second mask plate.

DETAILED DESCRIPTION

The technical solutions of the present disclosure will be described hereinafter in a clear and complete manner in conjunction with the drawings in the embodiments of the present disclosure. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
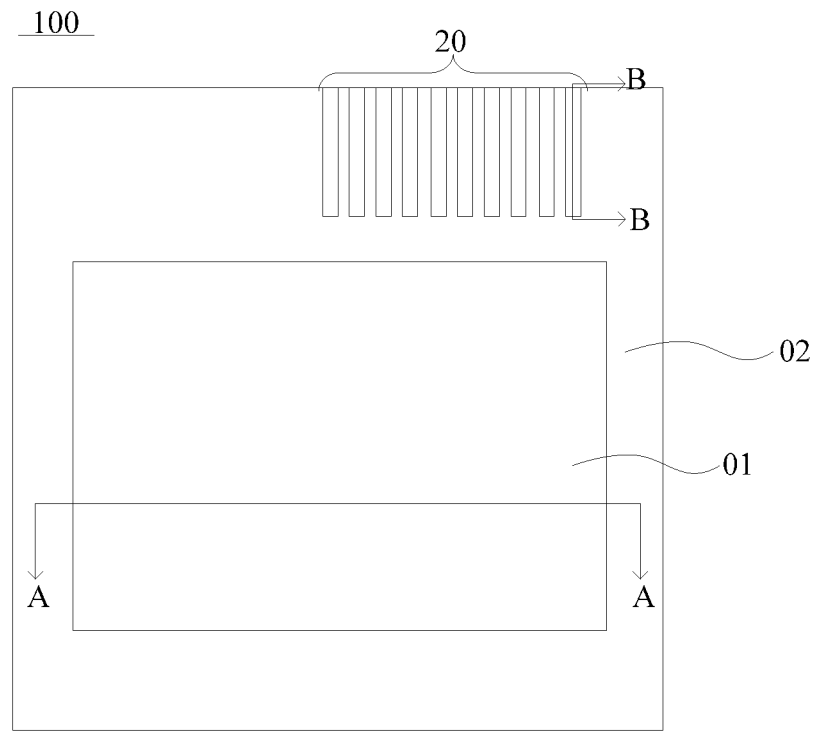
FIG. 1 is a top view showing an array substrate according to the embodiments of the present disclosure.
Figure 2A:
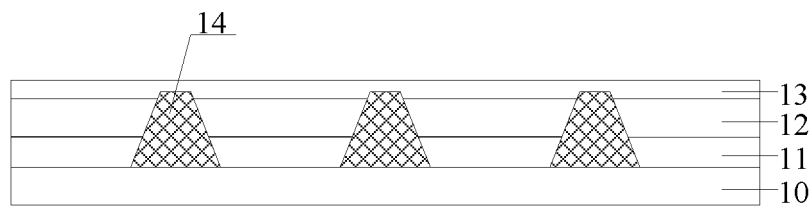
FIG. 2a is a sectional view along a line AA in FIG. 1.
Figure 2B:
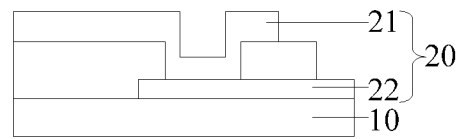
FIG. 2b is a sectional view along a line BB in FIG. 1.
Figure 2C:
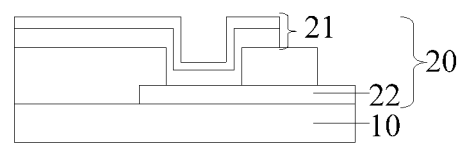
FIG. 2c is another sectional view along line BB in FIG. 1.

In some embodiments, the present disclosure provides an array substrate. As shown in FIG. 1, an array substrate 100 includes a display region 01 and a peripheral region 02. As shown in FIG. 2a, the display region 01 includes an anode 11, an organic material functional layer 12 and a cathode 13 that are provided on a base substrate 10 in sequence. As shown in FIGS. 1, 2b and 2c, the peripheral region 02 includes a plurality of touch electrode leads 20 that is insulated from each other, and each of the touch electrode leads 20 includes a first touch electrode lead 21 and a second touch electrode lead 22.

The first touch electrode lead 21 is arranged at a top position of the array substrate 100 relative to an upper surface of the base substrate 10, and electrically connected to a corresponding touch electrode arranged on a packaging substrate. The second touch electrode lead 22 is arranged at a position close to the base substrate 10, wherein one end of the second touch electrode lead is electrically connected to the first touch electrode lead 21, and the other end of the second touch electrode lead is electrically connected to a touch IC; and a thickness of the first touch electrode lead 21 is greater than a thickness of the cathode 3.

It should be noted that, firstly, as shown in FIG. 1, the peripheral region 02 is provided at a periphery of the display region 01. The display region 01 is configured to display an image, and the peripheral region 02 is used for wiring.

The display region 01 includes a plurality of sub-pixels. Each of the sub-pixels includes an anode 11, an organic material functional layer 12 and a cathode 13. In each of the sub-pixels, for example, a cathode 13 on the organic material functional layer 12 may be of an integrated structure. Adjacent sub-pixels are insulated from each other by a Pixel Definition Layer (PDL) 14.

Secondly, the organic material functional layer 12 at least includes a light emitting layer, and may further include an electron transport layer and a hole transport layer that are provided at two sides of the light-emitting layer respectively. Based on that, for improving the efficiency of injecting electrons and holes into the light-emitting layer, the organic material functional layer 12 may further includes an electron injection layer provided between the cathode 13 and the electron transport layer, and a hole injection layer provided between the anode 11 and the hole transport layer.

In addition, according to different materials of the anode 11 and the cathode 13, the array substrates can be classified into a single-side light emitting array substrate and a double-side light emitting array substrate. In other words, when one of the anode 11 and the cathode 13 is made of an opaque material, the array substrate 100 is a single-side light emitting array substrate, and when both the anode 11 and the cathode 13 are made of transparent materials, the array substrate 100 is a double-side light emitting array substrate.

The single-side light emitting array substrates can be classified into a top light emitting array substrate and a bottom light emitting array substrate according to different materials of the anode 11 and the cathode 13. Specifically, when the anode 11 is provided close to the base substrate 10, the anode 13 is provided away from the base substrate 10, the anode 11 is made of a transparent conductive material and the cathode 13 is made of an opaque conductive material, the base substrate 10 may be called a bottom light emitting array substrate because the light is emitted from a side of the base substrate 10 of the array substrate. When the anode 11 is made of the opaque conductive material and the cathode 13 is made of the transparent conductive material, since the light is emitted from the array substrate at a side of the array substrate away from the base substrate 10, the base substrate 10 may be called a top light emitting array substrate.

Thirdly, in the embodiments of the present disclosure, a top position relative to an upper surface of the base substrate 10 can be a position of an upper surface of a post spacer (PS), or can be a position of an upper surface of a total thickness of the post spacer and the pixel definition layer 14. The top position is not limited herein.

Based on that, the second touch electrode lead 22 needs to be connected to the touch IC, and thus, the second touch electrode lead 22 needs to be provided at a relatively flat position close to both the base substrate 10 and an edge of the array substrate 100, so that the second touch electrode lead 22 needs to be electrically connected to the first touch electrode lead 21 through a via hole provided in the post spacer or provided in both the post spacer and the pixel definition layer.

Fourthly, the first touch electrode leads 21 are arranged at a top position of the array substrate 100 relative to an upper surface of the base substrate 10. That is, in the array substrate 100, the first touch electrode leads 21 are uncovered. Therefore, after the array substrate 100 is attached to the packaging substrate, the first touch electrode leads 21 provided on the array substrate 100 relative to an upper surface of the base substrate 10 are in contact with the packaging substrate. Based on that, the touch electrodes can be provided on the packaging substrate at a side facing the array substrate 100. As a result, it may be provided on the packaging substrate the touch electrode wires that extend to positions corresponding to the touch electrode leads 20 on the array substrate 100 and are electrically connected to the touch electrodes. When the array substrate 100 is attached to the packaging substrate, the first touch electrode leads 21 and the touch electrode wires are connected respectively, and closely contact with each other at the contacting positions under the pressure for attaching the array substrate 100 and the packaging substrate, so as to reduce a contact resistance. As a result, the touch electrodes can be connected to the touch IC by means of the touch electrode wires, the first touch electrode leads 21 and the second touch electrode leads 22, so as to fulfill the touch function.

The first touch electrode leads 21 have one to one correspondence with the touch electrode wires.

In the embodiment of the present disclosure, the touch electrodes and the touch electrode wires electrically connected to the touch electrodes are provided on the packaging substrate at a side facing the array substrate 100. Thus, after the array substrate 100 is attached to the packaging substrate, the base substrate 10 of the array substrate 100 and the packaging substrate are thinned synchronously so as to reduce the thickness of the whole OLED display panel. Since the thickness of the first touch electrode leads is relatively large, it is avoided a poor contact between the first touch electrode leads and the touch electrode wires on the packaging substrate at the contacting positions due to a small thickness of the first control electrode leads 21, so as to ensure the contact stability. In addition, when the touch electrode leads 20 are provided on the array substrate, the touch IC and the driving display IC may be bonded synchronously, so as to realize a simpler manufacturing process.

Alternatively, as shown in FIG. 2b, the first touch electrode lead 21 is one layer of metal wires.

In other words, before or after the cathode 13 is formed, the first touch electrode lead 21 is formed by a mask plate in an evaporation process, and such formation of the first touch electrode lead 21 may be implemented by providing a plurality of independent small openings corresponding to the first touch electrode lead 21 in the mask plate. Based on that, the cathode 13 is formed through another evaporation process. Since the cathode 13, i.e. the cathodes in all of the sub-pixels are of an integrated structure, only a larger opening corresponding to the cathode 13 needs to be provided on the mask plate in this evaporation process.

Alternatively, as shown in FIG. 2c, the first touch electrode lead 21 is formed by two layers of metal wires overlapping each other completely, and a lower one of the two layers of metal wires is arranged on a same layer as the cathode 13.

That is, the cathode 13 and one of the two layers of metal wires of the first touch electrode lead 21 are firstly formed by a mask plate through a single evaporation process. In this evaporation process, the plurality of independent small openings corresponding to the first touch electrode lead 21 and a larger opening corresponding to the cathode 13 are provided on the mask plate. Based on that, the other one of the two layers of metal wires of the first touch electrode lead 21 are formed through a second evaporation process. In this evaporation process, only a plurality of independent small openings corresponding to the first touch electrode lead 21 needs to be provided on the mask plate.

Based on that, no matter whether the first touch electrode lead 21 is formed by a layer of metal wires or two layers of metal wires, its thickness can ensure an appropriate contact between the first touch electrode leads and the touch electrode wires on the packaging substrate.

Alternatively, the first touch electrode lead 21 may have a thickness ranging from 1000 Å to 3000 Å, so that thickness of the whole array substrate 100 is not too large.

Figure 3:
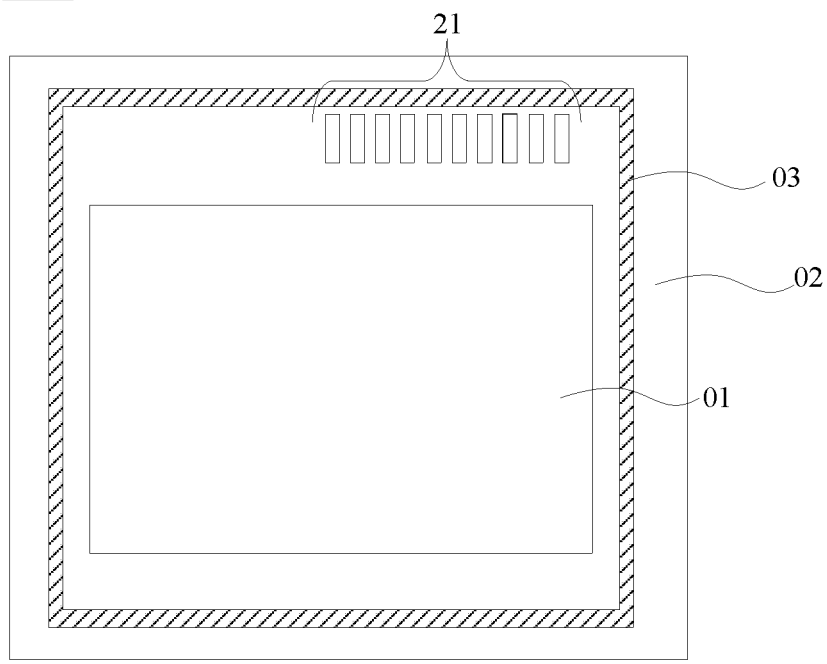
FIG. 3 is another top view showing an array substrate according to the embodiments of the present disclosure.

In addition, as shown in FIG. 3, a packaging region 03 is included within the peripheral region 02, and the first touch electrode leads 21 are provided between the packaging region 03 and the display region 01.

In such a way, the stability of the material of the first touch electrode lead 21 can be ensured. The material can be prevented from being oxidized particularly when the first touch electrode lead 21 includes two layers of metal wires and the material of one of the two layers of metal wires is the same as that of the cathode 13. Therefore, the stability of the contact between the first touch electrode leads 21 and the touch electrode wires on the packaging substrate can be ensured.

Figure 4:
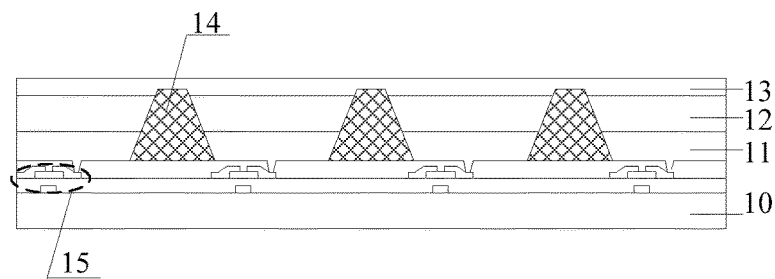
FIG. 4 is another sectional view along the line AA in FIG. 1.

In the embodiments of the present disclosure, the sub-pixels of the display region 01 may include the anode 11, the organic material function layer 12 and the cathode 13. Based on that, as shown in FIG. 4, each sub-pixel further includes a TFT 15. The TFT includes a gate electrode, a gate insulation layer, a semiconductor active layer, a source electrode and a drain electrode, and the drain electrode is electrically connected to the anode 11.

Based on that, the second touch electrode leads 22 are arranged on a same layer as the gate electrodes, or the second touch electrode leads 22 are arranged on a same layer as both the source electrodes and the drain electrodes. That is, the second touch electrode lead 22 and the gate electrode, or the second touch electrode lead 22 and the source electrode and the drain electrode are formed in a single patterning process, so as to reduce the number of the patterning processes.

It should be noted that, in the embodiments of the present disclosure, the type of the TFT is not particularly defined. The TFT can be an amorphous silicon TFT, a low temperature poly-silicon TFT, a metallic oxide TFT, an organic TFT or the like. The specific types are not limited. Besides, the TFT may be a bottom-gate TFT or a top-gate TFT.

Figure 5:
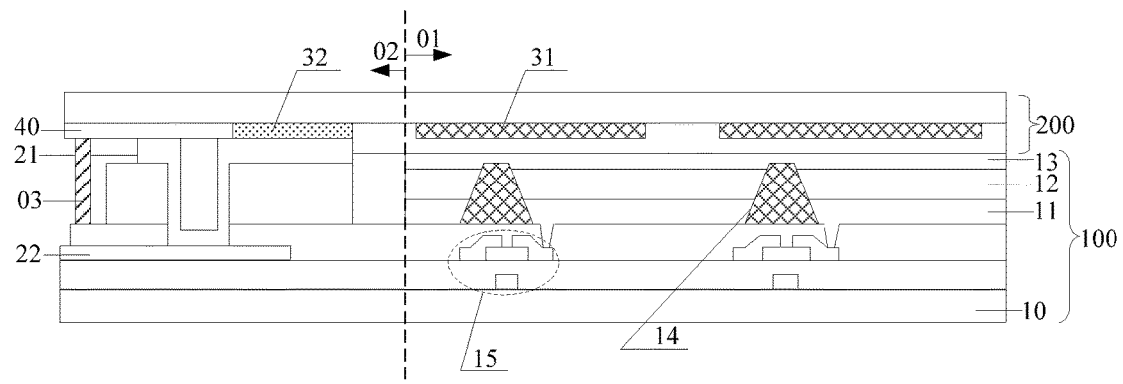
FIG. 5 is a sectional view showing an OLED display substrate according to the embodiments of the present disclosure.

In some embodiments, the present disclosure further provides an OLED display panel. As shown in FIG. 5, the OLED display panel includes the array substrate 100 and the packaging substrate 200. Touch electrodes 31, touch electrode wires 32 electrically connected to the touch electrodes and a protection layer 40 are arranged on the packaging substrate 200 at a side facing the array substrate 100 (the electrical connections are not shown), and at least a portion of each of the touch electrode wires 32 is not covered by the protection layer 40; and the touch electrode wires 32 and first touch electrode leads 21 are arranged in one-to-one correspondence manner, and the uncovered portion of each of the touch electrode wires 32 is in direct contact with the corresponding first touch electrode lead 21.

It should be noted that, firstly, the touch electrodes 31 may be arranged on the packaging substrate 200 in any possible manner, as long as the touch IC can determine a touch position by the touch electrodes 31. FIG. 5 illustratively shows that the touch electrodes 31 and the touch electrode wires 32 are provided on the packaging substrate 200.

The touch electrodes 31 are provided within the display region 01, and the touch electrode wires 32 extend to the peripheral region 02.

Secondly, at least a portion of the touch electrode wire 32 is uncovered by the protection layer 40. In other words, the protection layer 40 is provided at a surface of the packaging substrate, and it can be removed at a position corresponding to the touch electrode wire 32 by etching the protection layer 40. At the position corresponding to the touch electrode wire 32, the protection layer 40 can be partly removed so that a portion of the touch electrode wire 32 is uncovered, or the protection layer 40 is completely removed so that the touch electrode wire 32 is completely uncovered.

The metal material of the touch electrode wire 32 is stable, and thus, even if the touch electrode wire 32 is uncovered, it cannot be oxidized rapidly so that the stability of the contact between the first touch electrode leads 21 and the touch electrode wire 32 is ensured.

Thirdly, the touch electrode wires 32 uncovered by the packaging substrate 200 needs to be in contact with the first control electrode leads 21 on the array substrate 100 after the packaging substrate is attached to the array substrate 100. Therefore, the touch electrode wires 32 and the first touch electrode leads 21 in a one-to-one correspondence manner are vertical to each other respectively.

In the embodiments of the present disclosure, when the array substrate 100 is attached to the packaging substrate 200, under the pressure for attaching the array substrate 100 and the packaging substrate, the first touch electrode leads 21 provided at a top position of the array substrate 100 relative to the upper surface of the base substrate 10 can be in close contact with the corresponding touch electrodes 32 on the packaging substrate respectively, so that the touch electrodes 31 are connected to the control IC by the touch electrode wires 32, the first touch electrode leads 21 and the second touch electrode leads 22, thereby to realize the touch function. Based on that, the control electrode 31 and the touch electrode wire 32 may be provided on the packaging substrate 200 at a side facing the array substrate 100. As a result, after the array substrate 100 is attached to the packaging substrate 200, the base substrate 10 of the array substrate 100 and the packaging substrate 200 are thinned synchronously so as to reduce the thickness of the whole OLED display panel. Since the thickness of the first touch electrode leads is relatively large, it is avoided a poor contact between the first touch electrode leads and the touch electrode wires 32 on the packaging substrate 100 due to a small thickness of the first control electrode leads 21, so as to ensure the contact stability. In addition, when the touch electrode leads 20 are provided on the array substrate, the touch IC and the driving display IC may be bonded synchronously, so as to realize a simpler manufacturing process.

Based on that, in the embodiments, the present disclosure provides a display device, which includes the above OLED display panel.

Further, the display device may include a driving display IC and a touch IC. The driving display IC and the touch IC may be integrated on the circuit board.

In the embodiments of the present disclosure, the display device may be any product or member having a display function, such as an OLED display, an OLED television, a digital photo frame, a mobile phone or a tablet computer.

Figure 8:
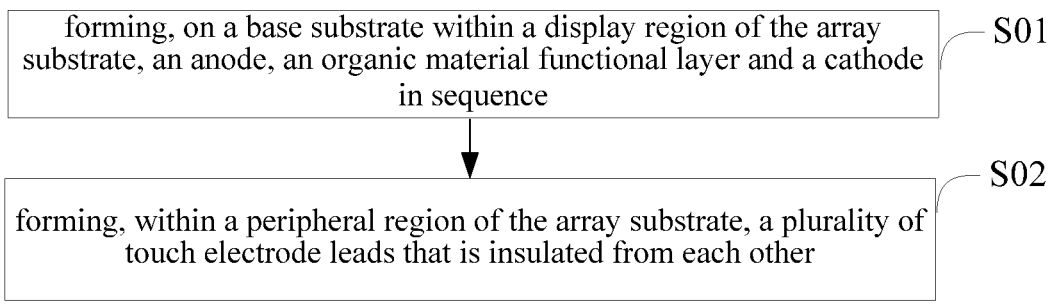
FIG. 8 is a flow chart showing a method of manufacturing an array substrate according to the embodiments of the present disclosure.

In the embodiments, the present disclosure provides a method of manufacturing the above array substrate. As shown in FIGS. 1, 2a and 8, the method includes: forming, on a base substrate 100 within a display region 01 of the array substrate 100, an anode 11, an organic material functional layer 12 and a cathode 13 in sequence (S01). As shown in FIGS. 1, 2b, 2c and 8, the method further include: forming, within a peripheral region 02 of the array substrate 100, a plurality of touch electrode leads 20 that is insulated from each other, wherein each of the touch electrode leads includes a first touch electrode lead 21 and a second touch electrode lead 22 (S02).

The first touch electrode lead 21 is formed at a top position of the array substrate 100 relative to an upper surface of the base substrate 100 by an evaporation process, and electrically connected to a corresponding touch electrode 31 arranged on an packaging substrate 200; the second touch electrode lead 22 is formed at a position close to the base substrate 100 by a patterning process, wherein one end of the second touch electrode lead is electrically connected to the first touch electrode lead 21, and the other end of the second touch electrode lead is electrically connected to a touch IC; and a thickness of the first touch electrode lead 21 is greater than a thickness of the cathode 13.

It should be noted that, firstly, in the embodiments of the present disclosure, a top position relative to an upper surface of the base substrate 10 can be a position of an upper surface of a post spacer, or can be a position of an upper surface of a total thickness of the post spacer and the pixel definition layer 14. The top position is not limited herein.

Based on that, the second touch electrode lead 22 needs to be connected to the touch IC, and thus, the second touch electrode lead 22 needs to be provided at a relatively flat position close to both the base substrate 10 and an edge of the array substrate 100, so that the second touch electrode lead 22 needs to be electrically connected to the first touch electrode lead 21 through a via hole provided in the post spacer or provided in both the post spacer and the pixel definition layer.

Secondly, the first touch electrode leads 21 are arranged at a top position of the array substrate 100 relative to an upper surface of the base substrate 10. That is, in the array substrate 100, the first touch electrode leads 21 are uncovered. Therefore, after the array substrate 100 is attached to the packaging substrate, the first touch electrode leads 21 arranged at a top position of the array substrate 100 relative to an upper surface of the base substrate 10 are in contact with the packaging substrate. Based on that, the touch electrodes 31 can be provided on the packaging substrate 200 at a side facing the array substrate 100. As a result, it may be provided on the packaging substrate the touch electrode wires 32 that extend to positions corresponding to the touch electrode leads 20 on the array substrate 100 and are electrically connected to the touch electrodes 31. When the array substrate 100 is attached to the packaging substrate 200, the first touch electrode leads 21 and the touch electrode wires are connected respectively, and closely contact with each other at the contacting positions under the pressure for attaching the array substrate 100 and the packaging substrate, so as to reduce a contact resistance. As a result, the touch electrodes 31 can be connected to the touch IC by means of the touch electrode wires 32, the first touch electrode leads 21 and the second touch electrode leads 22, so as to fulfill the touch function.

The first touch electrode leads 21 have one to one correspondence with the touch electrode wires 32.

In the embodiment of the present disclosure, the touch electrodes 31 and the touch electrode wires 32 electrically connected to the touch electrodes 31 are provided on the packaging substrate 200 at a side facing the array substrate 100. Thus, after the array substrate 100 is attached to the packaging substrate 200, the base substrate 10 of the array substrate 100 and the packaging substrate 200 are thinned synchronously so as to reduce the thickness of the whole OLED display panel. Since the thickness of the first touch electrode leads 21 is relatively large, it is avoided a poor contact between the first touch electrode leads 21 and the touch electrode wires 32 on the packaging substrate 200 at the contacting positions due to a small thickness of the first control electrode leads 21, so as to ensure the contact stability. In addition, when the touch electrode leads 20 are provided on the array substrate, the touch IC and the driving display IC may be bonded synchronously, so as to realize a simpler manufacturing process.

Figure 6A:
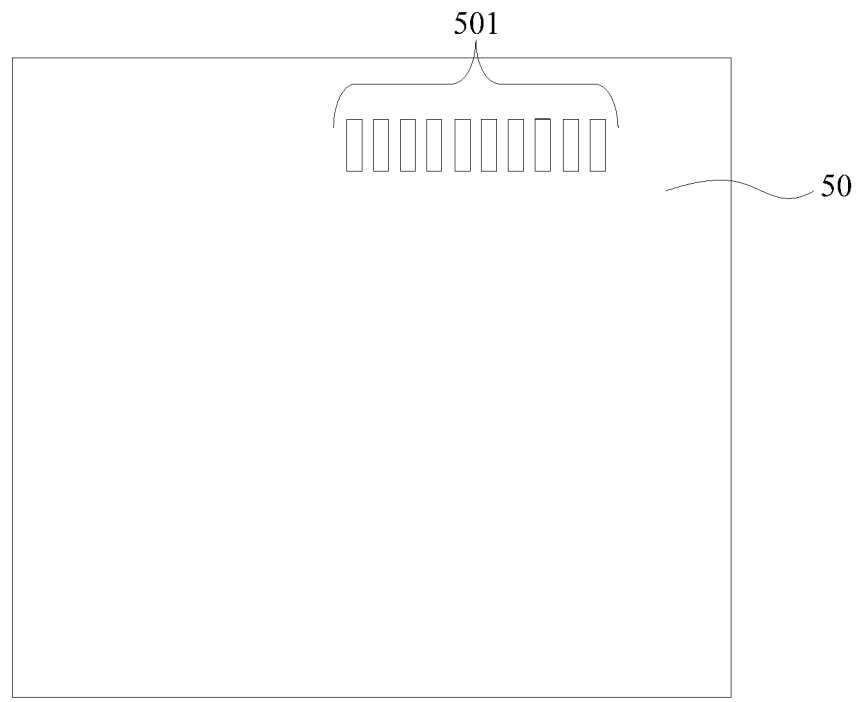
FIG. 6a is a schematic view showing a first mask plate according to the embodiments of the present disclosure.
Figure 9:
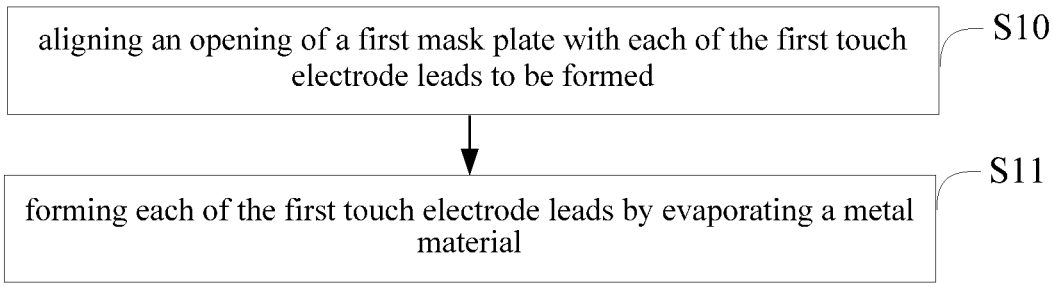
FIG. 9 is a flow chart showing a method of forming a touch electrode lead by a layer of metal wires according to the embodiments of the present disclosure.

Alternatively, as shown in FIG. 2b, the first touch electrode lead 21 is formed by one layer of metal wires. Based on that, as shown in FIG. 9, the step of forming the first touch electrode leads 21 includes steps of: for each of the first electrodes, step S10: as shown in FIG. 6a, aligning an opening 501 of a first mask plate 50 with each of the first touch electrode leads 21 to be formed; and step S11: forming each of the first touch electrode leads 21 as shown in FIG. 3 by evaporating a metal material.

It should be noted that, before or after the cathode 13 is formed, the first touch electrode leads 21 may be formed in the steps S10-S11. Based on that, the cathode 13 is formed in another evaporation process. Since the cathode 13, i.e. the cathodes of all the sub-pixels are of an integrated structure, only a large opening corresponding to the cathode 13 needs to be provided on the mask plate in this evaporation process.

Figure 6B:
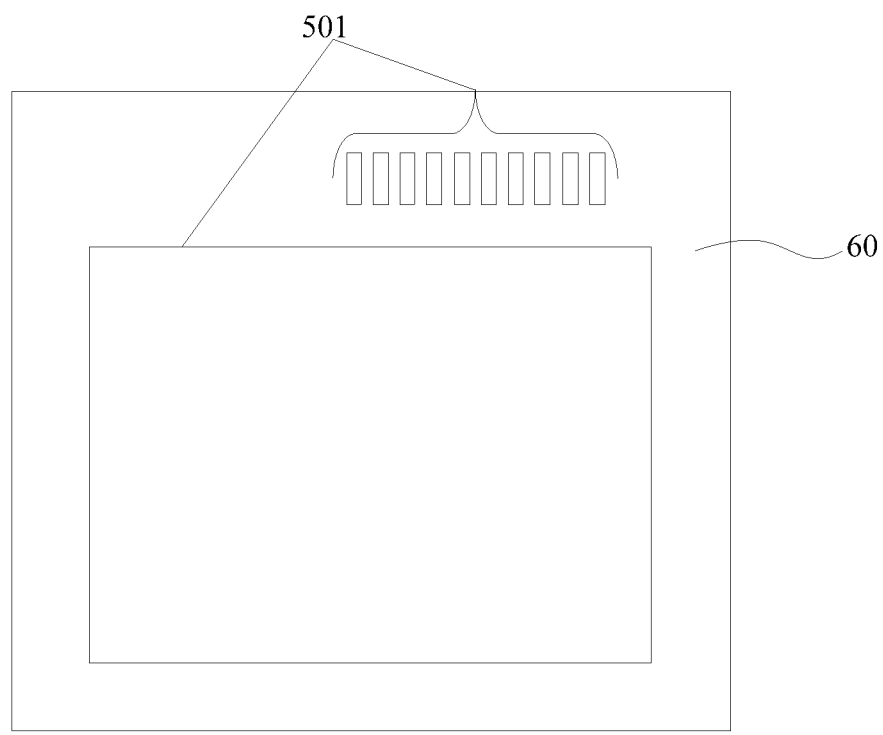
FIG. 6b is a schematic view showing a second mask plate according to the embodiments of the present disclosure.
Figure 10:
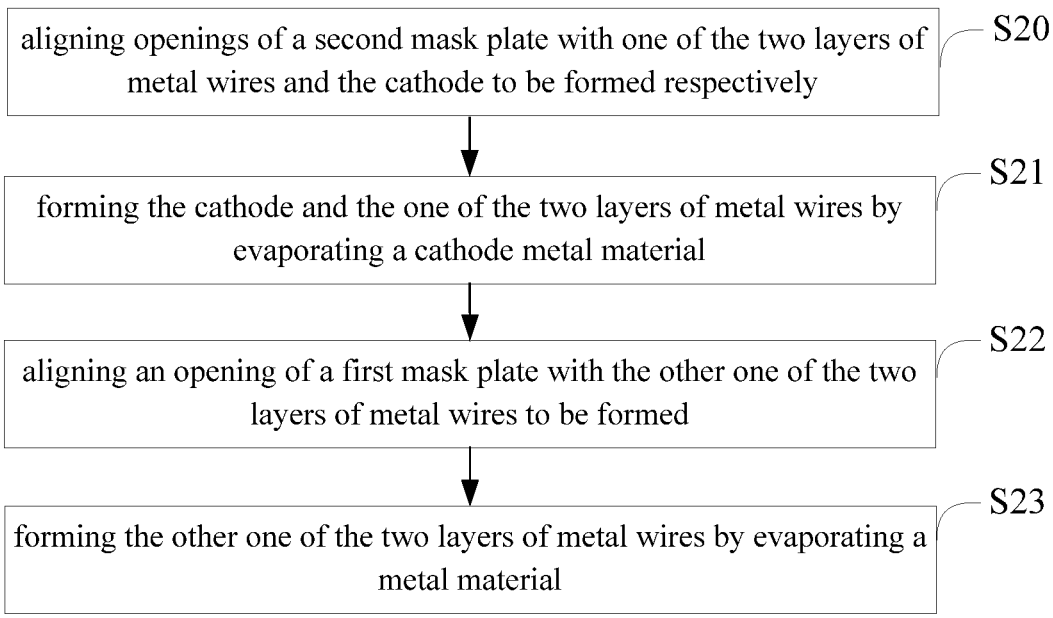
FIG. 10 is a flow chart showing a method of forming a touch electrode lead by two layers of metal wires according to the embodiments of the present disclosure.

Alternatively, as shown in FIG. 2c, the first touch electrode lead 21 is formed by two layers of metal wires overlapping each other completely. Based on that, as shown in FIG. 10, the step of forming the first touch electrode lead 21 includes steps of: for each of the first touch electrodes, step S20: as shown in FIG. 6b, aligning openings 501 of a second mask plate 60 with one of the two layers of metal wires and the cathode 13 to be formed respectively;

step S21: forming the cathode 13 and the one of the two layers of metal wires by evaporating a cathode metal material;

step S22: aligning an opening 501 of a first mask plate 50 shown in FIG. 6a with the other one of the two layers of metal wires to be formed, wherein since the two layers of metal wires overlap completely, the opening 501 of the mask plate corresponds to the metal wire, that is, the opening 501 corresponds to the first touch electrode lead 21; and step S23: forming the other one of the two layers of metal wires by evaporating a metal material.

Figure 7:
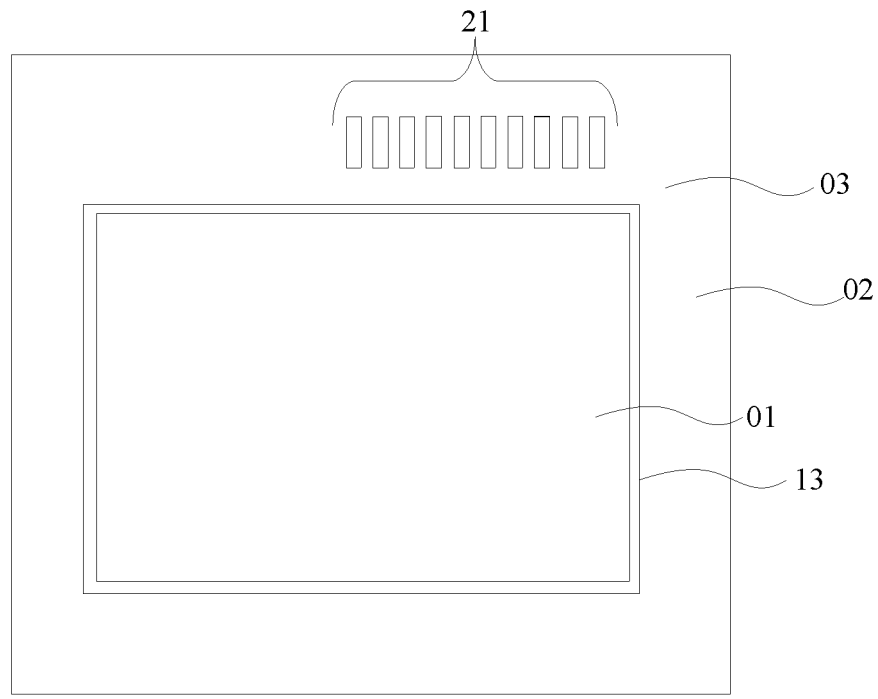
FIG. 7 is a schematic view showing first touch electrode leads and a cathode formed by an evaporation process according to the embodiments of the present disclosure.

The cathode 13 and the first touch electrode leads 21 shown in FIG. 7 are formed in the above steps S20-S23.

Based on that, as shown in FIG. 4, the method further includes a step of forming TFTs 15, wherein each of the TFTs 15 includes a gate electrode, a gate insulation layer, a semiconductor active layer, a source electrode and a drain electrode, and the drain electrode is electrically connected to the anode 11

Based on that, the second touch electrode leads 22 and the gate electrodes are formed by a single pattering process, or the second touch electrode leads 22, the source electrodes and the drain electrodes are formed by a single patterning process. In such a way, the number of the patterning processes can be reduced.

Figure 11:
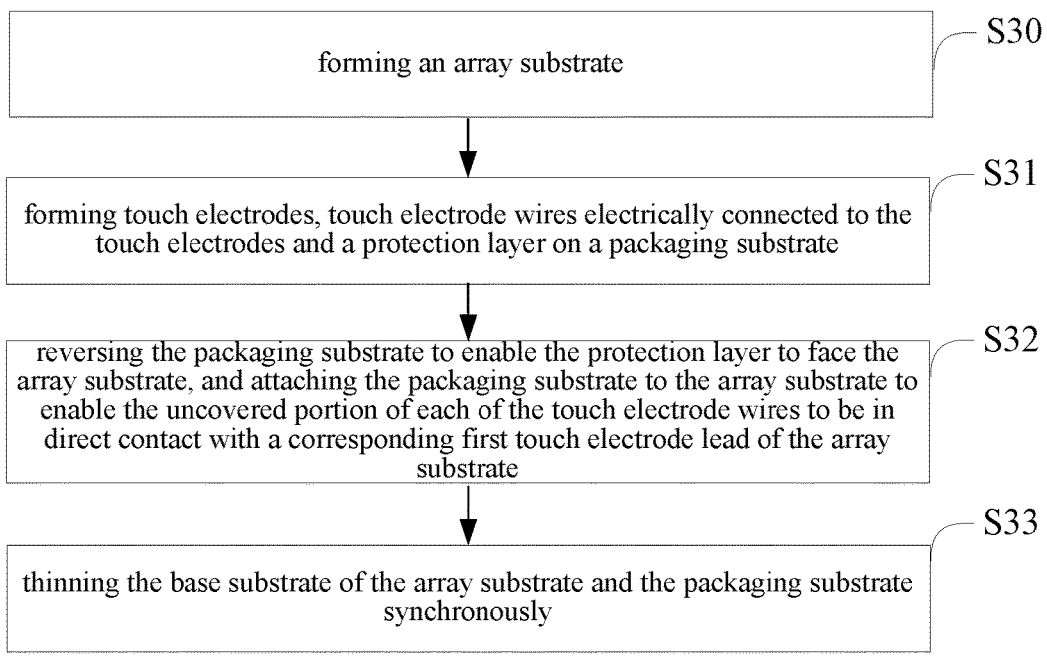
FIG. 11 is a flow chart showing a method of manufacturing an OLED display panel according to the embodiments of the present disclosure.

In the embodiments of the present disclosure, the present disclosure provides a method of manufacturing an OLED display panel. Referring to the OLED display panel shown in FIG. 5 and the flow chart shown in FIG. 11, the manufacturing method includes steps of:

step S30: forming an array substrate 100 according to the above method of manufacturing the array substrate;

step S31: forming touch electrodes 31, touch electrode wires 32 electrically connected to the touch electrodes 31 and a protection layer 40 on a packaging substrate 200 (the electrical connections are not shown), wherein at least a portion of each of the touch electrode wires 32 is not covered by the protection layer, the touch electrodes 31 may be arranged on the packaging substrate 200 in any possible manner, as long as the touch IC can determine a touch position by the touch electrodes 31, the touch electrode 31 is provided within the display region 01, and the touch electrode wire 32 extends to the peripheral region 02;

step S32: reversing the packaging substrate 200 to enable the protection layer to face the array substrate 100, and attaching the packaging substrate 200 to the array substrate 100 to enable the uncovered portion of each of the touch electrode wires 32 to be in direct contact with a corresponding first touch electrode lead of the array substrate 100, wherein the touch electrode wires 32 and first touch electrode leads 21 are arranged in one-to-one correspondence manner; and step S33: thinning the base substrate 10 of the array substrate 100 and the packaging substrate 200 synchronously. For example, the thickness can be reduced into half of the original thickness.

In the embodiments of the present disclosure, when the array substrate 100 is attached to the packaging substrate 200, under the pressure for attaching the array substrate 100 and the packaging substrate 200, the first touch electrode leads 21 provided at a top position of the array substrate 100 relative to the upper surface of the base substrate 10 can be in close contact with the corresponding touch electrodes 32 on the packaging substrate 200 respectively, so that the touch electrodes 31 are connected to the control IC by the touch electrode wires 32, the first touch electrode leads 21 and the second touch electrode leads 22, thereby to realize the touch function. Based on that, the control electrode 31 and the touch electrode wire 32 may be provided on the packaging substrate 200 at a side facing the array substrate 100. As a result, after the array substrate 100 is attached to the packaging substrate 200, the base substrate 10 of the array substrate 100 and the packaging substrate 200 are thinned synchronously so as to reduce the thickness of the whole OLED display panel. Since the thickness of the first touch electrode leads is relatively large, it is avoided a poor contact between the first touch electrode leads and the touch electrode wires 32 on the packaging substrate 100 due to a small thickness of the first control electrode leads 21. In addition, when the touch electrode leads 20 are provided on the array substrate, the touch IC and the driving display IC may be bonded synchronously, so as to realize a simpler manufacturing process.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:
1. A display panel, comprising:
an array substrate comprising a display region and a peripheral region surrounding the display region;
a packaging substrate opposite to the array substrate;
a plurality of touch electrode wires in the peripheral region, wherein the touch electrode wires are on a side of the packaging substrate facing the array substrate;
a protection layer on the side of the packaging substrate facing the array substrate, and configured to expose the plurality of touch electrode wires; and
a plurality of touch electrode leads in the peripheral region, wherein each of the plurality of touch electrode leads comprises a first touch electrode lead and a second touch electrode lead, and the touch electrode wires and first touch electrode leads are arranged in a one-to-one correspondence manner;
wherein the first touch electrode lead is between the plurality of touch electrode wires and the second touch electrode lead;
the first touch electrode lead is provided with a U-shaped portion, and configured to directly connect to at least part of the corresponding touch electrode wire, the second touch electrode lead, and the protection layer;
the protection layer and the touch electrode wires are on a same layer, and a side surface of the protection layer is in direct physical contact with a side surface of one of the touch electrode wires, wherein the side surface of the protection layer and the side surface of the touch electrode wire are vertical to an extension direction of the touch electrode wire;

the second touch electrode lead is on a side of the array substrate facing the packaging substrate; one end of the second touch electrode lead is electrically connected to the first touch electrode lead, and the other end of the second touch electrode lead is electrically connected to a touch Integrated Circuit (IC); and the U-shaped portion comprises a concave portion and a convex portion, the concave portion is on a side of the convex portion distal to a base substrate of the array substrate, and in direct physical contact with the convex portion, the convex portion is configured to extend through a via hole provided in a post spacer of the array substrate to directly connect the second touch electrode lead, and a gap is provided on an inner surface of the concave portion.

2. The display panel according to claim 1, wherein the display region comprises an anode, an organic material functional layer, and a cathode that are arranged on the base substrate in sequence, wherein the plurality of touch electrode leads are insulated from each other;

the first touch electrode lead is arranged at a top position of the array substrate relative to an upper surface of the base substrate, and electrically connected to a corresponding touch electrode arranged on a packaging substrate;

the second touch electrode lead is arranged at a position close to the base substrate;

a thickness of the first touch electrode lead is greater than a thickness of the cathode; and the first touch electrode lead is formed by a layer of metal wires.

3. The display panel according to claim 2, wherein the first touch electrode lead is formed by two layers of metal wires overlapping each other completely, and a lower one of the two layers of metal wires is arranged on a same layer as the cathode.

4. The display panel according to claim 2, wherein the array substrate further comprises Thin Film Transistors (TFTs) arranged between the base substrate and the anode,
wherein each of the TFTs comprises a gate electrode, a source electrode, and a drain electrode; and
the second touch electrode leads are arranged on a same layer as the gate electrodes, or the second touch electrode leads are arranged on a same layer as both the source electrodes and the drain electrodes.

5. The display panel according to claim 1, wherein the array substrate further comprises a packaging region within the peripheral region, wherein the first touch electrode lead is arranged at a position between the packaging region and the display region.

6. The display panel according to claim 1, wherein the first touch electrode lead has a thickness ranging from 1000 A to 3000 A.

7. The display panel according to claim 2, wherein the organic material functional layer comprises a light-emitting layer, an electron transport layer, and a hole transport layer arranged at two sides of the light-emitting layer respectively, an electron injection layer arranged between the cathode and the electron transport layer, and a hole injection layer arranged between the anode and the hole transport layer.

8. The display panel according to claim 2, wherein the touch electrode is arranged on the packaging substrate at a side facing the array substrate.

9. The display panel according to claim 2, wherein the touch electrodes are arranged on the packaging substrate at the side facing the array substrate, and the display panel is an Organic Light-Emitting Diode (OLED) display panel.

10. The display panel according to claim 9, wherein the first touch electrode lead is formed by a layer of metal wires.

11. The display panel according to claim 9, wherein the first touch electrode lead is formed by two layers of metal wires overlapping each other completely, and a lower one of the two layers of metal wires is arranged on a same layer as the cathode.

12. The display panel according to claim 9, wherein the array substrate further comprises Thin Film Transistors (TFTs) arranged between the base substrate and the anode,
wherein each of the TFTs comprises a gate electrode, a source electrode, and a drain electrode; and
the second touch electrode leads are arranged on a same layer as the gate electrodes, or the second touch electrode leads are arranged on a same layer as both the source electrodes and the drain electrodes.

13. The display panel according to claim 9, wherein the array substrate further comprises a packaging region within the peripheral region, wherein the first touch electrode lead is arranged at a position between the packaging region and the display region.

14. The display panel according to claim 9, wherein the first touch electrode lead has a thickness ranging from 1000 A to 3000 A.

15. A display device comprising the display panel according to claim 1.

16. A method of manufacturing an array substrate, comprising steps of:
forming, on a base substrate within a display region of the array substrate, an anode, an organic material functional layer, and a cathode in sequence; and
forming, within a peripheral region of the array substrate, a plurality of touch electrode leads that are insulated from each other,
wherein a first display panel comprises the array substrate and a packaging substrate opposite to the array substrate, and the peripheral region surrounds the display region;
the first display panel further comprises a plurality of touch electrode wires, a protection layer, and a plurality of touch electrode leads;
the plurality of touch electrode wires are in the peripheral region, and on a side of the packaging substrate facing the array substrate;
the protection layer is on the side of the packaging substrate facing the array substrate, and configured to expose the plurality of touch electrode wires; and
the plurality of touch electrode leads is in the peripheral region, each of the plurality of touch electrode leads comprises a first touch electrode lead and a second touch electrode lead, and the touch electrode wires and first touch electrode leads are arranged in a one-to-one correspondence manner;
wherein the first touch electrode lead is between the plurality of touch electrode wires and the second touch electrode lead; the first touch electrode lead is provided with a U-shaped portion, and configured to directly connect to at least part of the corresponding touch electrode wire, the second touch electrode lead and the protection layer;
the protection layer and the touch electrode wires are on a same layer, and a side surface of the protection layer is in direct physical contact with a side surface of one of the touch electrode wires, wherein the side surface of the protection layer and the side surface of the touch electrode wire are vertical to an extension direction of the touch electrode wire;

the second touch electrode lead is on a side of the array substrate facing the packaging substrate; one end of the second touch electrode lead is electrically connected to the first touch electrode lead, and the other end of the second touch electrode lead is electrically connected to a touch Integrated Circuit (IC);

the U-shaped portion comprises a concave portion and a convex portion, the concave portion is on a side of the convex portion distal to a base substrate of the array substrate, and in direct physical contact with the convex portion, the convex portion is configured to extend through a via hole provided in a post spacer of the array substrate to directly connect the second touch electrode lead, and a gap is provided on an inner surface of the concave portion.

17. The method according to claim 16, wherein the first touch electrode lead is formed at a top position of the array substrate relative to an upper surface of the base substrate by an evaporation process, and is electrically connected to a corresponding touch electrode arranged on a packaging substrate;

the second touch electrode lead is formed at a position close to the base substrate by a patterning process; and a thickness of the first touch electrode lead is greater than a thickness of the cathode;

the first touch electrode lead is formed by a layer of metal wires, and the step of forming the plurality of first touch electrode leads, for each of the first touch electrodes, comprises steps of:

aligning an opening of a first mask plate with each of the first touch electrode leads to be formed; and forming each of the first touch electrode leads by evaporating a metal material.

18. The method according to claim 16, wherein the first touch electrode lead is formed by two layers of metal wires overlapping each other completely, and the step of forming a plurality of first touch electrode leads, for each of the first touch electrodes, comprises steps of:

aligning openings of a second mask plate with one of the two layers of metal wires and the cathode to be formed respectively;

forming the cathode and the one of the two layers of metal wires by evaporating a cathode metal material;

aligning an opening of a first mask plate with the other one of the two layers of metal wires to be formed; and forming the other one of the two layers of metal wires by evaporating a metal material.

19. The method according to claim 16, further comprising a step of: forming thin film transistors (TFTs), wherein each of the TFTs comprises a gate electrode, a source electrode, and a drain electrode; and the second touch electrode leads and the gate electrodes are formed by a single patterning process, or the second touch electrode leads, the source electrodes and the drain electrodes are formed by a single patterning process.

20. A method for manufacturing an Organic Light-Emitting Diode (OLED) display panel, comprising steps of:

forming an array substrate according to the method of claim 16;

forming touch electrodes, touch electrode wires electrically connected to the touch electrodes and a protection layer on a packaging substrate at the side facing the array substrate;

reversing the packaging substrate to enable the protection layer to face the array substrate, and attaching the packaging substrate to the array substrate to enable the first touch electrode lead to directly connect to at least part of the corresponding touch electrode wire; and thinning the base substrate of the array substrate and the packaging substrate synchronously.

* * * * *